United States Patent [19]

Toukhy et al.

[11] 4,377,631
[45] Mar. 22, 1983

[54] POSITIVE NOVOLAK PHOTORESIST COMPOSITIONS

[75] Inventors: Medhat A. Toukhy, Barrington; Leo Klawansky, West Warwick, both of R.I.

[73] Assignee: Philip A. Hunt Chemical Corporation, Palisades Park, N.J.

[21] Appl. No.: 275,883

[22] Filed: Jun. 22, 1981

[51] Int. Cl.³ .......................... G03C 1/54; G03C 1/60
[52] U.S. Cl. .................................. 430/192; 430/165; 430/191; 430/326; 430/311; 430/323; 430/330
[58] Field of Search ............... 430/192, 190, 191, 193, 430/165, 326

[56] References Cited

U.S. PATENT DOCUMENTS

| | | | |
|---|---|---|---|
| 3,130,048 | 4/1964 | Fritz et al. | 430/192 |
| 3,647,443 | 3/1972 | Rauner et al. | 430/192 |
| 3,666,473 | 5/1972 | Colom et al. | 430/192 |
| 4,173,470 | 11/1979 | Fahrenholtz et al. | 430/192 |
| 4,211,834 | 7/1980 | Lapadula et al. | 430/192 |

FOREIGN PATENT DOCUMENTS

| | | | |
|---|---|---|---|
| 2616992 | 3/1977 | Fed. Rep. of Germany | 430/192 |
| 1227602 | 4/1971 | United Kingdom | 430/190 |
| 1154749 | 6/1979 | United Kingdom | 430/193 |

Primary Examiner—Charles L. Bowers, Jr.
Attorney, Agent, or Firm—Kirschstein, Kirschstein, Ottinger & Cobrin

[57] ABSTRACT

Fast positive photoresist compositions employing cresol-formaldehyde novolak resins made from a mixture containing meta- and paracresol or ortho-, meta- and paracresol in a ratio selected from a given range and one or more of a selected group of naphthoquinone diazide sensitizing compounds. When dissolved in a mixture of organic solvents, the photoresist compositions are suitable for application as a thin coating to a substrate. After the coating has been dried, the coated substrate can be exposed to image-wise modulated actinic radiation even in the deep ultra-violet range and developed in alkaline solution, yielding a high-resolution relief pattern of resist on substrate useful for a number of applications.

10 Claims, 1 Drawing Figure

POSITIVE NOVOLAK PHOTORESIST COMPOSITIONS

CROSS REFERENCE TO RELATED APPLICATION

The invention which is the subject of this application is related to the invention which is the subject of copending Application Ser. No. 275,707, filed on June 22, 1981.

BACKGROUND OF THE INVENTION

1. Field of the Invention

The present invention relates generally to radiation-sensitive positive photoresist compositions and particularly to compositions containing cresol-formaldehyde novolak resins together with naphthoquinone diazide sensitizing agents.

2. Description of the Prior Art

Positive photoresist formulations such as are described in, for example, U.S. Pat. Nos. 3,666,473, 4,115,128 and 4,173,470, include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation-induced structural transformation which decreases its efficiency as a dissolution rate inhibitor for the novolak and, subsequently, the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern of photoresist on substrate.

The naphthoquinone diazide sensitizer compounds typically used in positive photoresists are highly absorptive when exposed to radiation in the conventional ultraviolet to near-ultraviolet range, i.e., radiation with a wavelength of from 400 to 450 nanometers, and the sensitizers are therefore quite photoactive in that range. Moreover, the sensitizers generally bleach in the conventional or near-ultraviolet range, i.e., the photoproducts of the radiation-induced structural transformation caused by the exposure of the sensitizer to the radiation are non-absorptive in that range of wavelengths and therefore the radiation is able to penetrate to the next layer of sensitizer after the exposure of the uppermost layer. The novolak resin itself absorbs very little in the 400 or 450 nanometer range and therefore the conventional resists prepared from the novolak resins and naphthoquinone diazide sensitizers are essentially transparent to radiation with these wavelengths and the radiation is able to penetrate the resist coating down to the interface between the coating and the substrate.

In most instances, the exposed and developed substrate will be subjected to treatment by a substrate-etchant solution. The photoresist coating protects the coated areas of the substrate from the etchant and thus the etchant is only able to etch the uncoated areas of the substrate, which, in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice and which are sought to be improved hereby include the photospeed of the resist, the development contrast thereof, the resist resolution, and the resist adhesion.

For the purposes of this specification, resist photospeed is defined as the minimum exposure time, assuming constant exposure energy per unit of time, required to render an exposed area of a dried resist coating of a given thickness on a substrate completely soluble to a developing solution. Increased photospeed is important for a photoresist, particularly in applications where a number of exposures are needed, for example, in generating multiple patterns by a repeated process, or where light of reduced intensity is employed such as, for example, in projection exposure techniques where the light is passed through a series of lenses and monochromatic filters. Thus, increased photospeed is particularly important for a resist composition employed in processes where a number of multiple exposures must be made to produce a mask or series of circuit patterns on a substrate. In measuring resist photospeed, optimum development conditions are utilized. These optimum conditions include a constant development temperature and time in a particular development mode, and a developer system selected to provide complete development of exposed resist areas while maintaining a maximum unexposed resist film thickness loss not exceeding 10 percent of initial thickness.

Development contrast, as used herein, refers to a comparison between the percentage of film loss in the exposed area of development with the percentage of film loss on the unexposed area. Ordinarily, development of an exposed resist coated substrate is continued until the coating on the exposed area is completely dissolved away and thus, development contrast can be determined simply by measuring the percentage of the film coating loss in the unexposed areas when the exposed coating areas are removed entirely. By definition, development contrast is always within an acceptable range under optimum development conditions because these conditions are selected to provide no more than 10 percent loss of film thickness in the unexposed areas, while the coating or film in the exposed areas is completely removed.

Resist resolution is defined as the capability of a resist system to reproduce the smallest equally spaced line pairs and intervening spaces of a mask which is utilized during exposure with a high degree of image edge acuity in the developed exposed spaces. Quantitatively, resist resolution can be measured by calculating, after development, the ratio of the width of the unexposed area corresponding to a line on the mask to the width of the exposed area corresponding to the adjacent space and comparing that ratio to the ratio of line and space widths on the mask itself. Ideally, the ratio of the widths on the developed resist-coated substrate should equal the ratio of the widths on the mask. In many industrial applications, particularly in the manufacture of miniaturized electronic components, a photoresist is required to provide a high degree of resolution for very small line and space widths (on the order of one micron or less).

It has been well established in the photoresist art that utilizing radiation in the deep ultraviolet range, for example, with a wavelength of 250 or 270 nanometers, for exposure of resist-coated substrates results in a great increase in resolution in the developed resist and enables the reproduction of lines and spaces of very small dimensions with high image-edge acuity. The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are beginning to be utilized as replacements for the negative resists.

There are two principal problems with the use of conventional positive photoresists in the production of miniaturized integrated circuit components. One is that the positive resists have slower photospeed than the negative resists. The second drawback with conventional positive photoresists is that the naphthoquinone diazide sensitizers which generally comprise the photosensitive component of these resists absorb substantially in the deep ultraviolet range where highest resolution can be achieved and the sensitizers must be used in substantial concentrations to be effective as solubility inhibitors, and thus the resists are somewhat opaque to radiation within this range and cannot be developed down to the interface with the substrate because the radiation cannot penetrate through the upper layers of the resist coating.

Various attempts have been made in the prior art to improve the photospeed of positive photoresist compositions. For example, in U.S. Pat. No. 3,666,473, a mixture of two phenol-formaldehyde novolak resins was utilized together with a typical sensitizer, said novolak resins being defined by their solubility rates in alkaline solutions of a particular pH and by their cloud points. In U.S. Pat. No. 4,115,128, a third component consisting of an organic acid cyclic anhydride was added to the phenolic resin and naphthoquinone diazide sensitizer to provide increased photospeed. These prior art compositions, however, while providing somewhat improved photospeed, involve the use of additional components or overly complex control of reaction conditions and detailed analysis of the components utilized, in comparison with compositions utilizing simply a single phenolic resin together with a simple sensitizer.

Another prior art photoresist composition, which has been commercially available, contains a novolak resin formed from a mixture of ortho-, meta-, and paracresols and subsequently chemically reacted with a particular naphthoquinone diazide sensitizer to produce a sensitized novolak; e.g., a novolak chemically bonded to a sensitizer. This prior art material, while possessing good resolution properties, does not have particularly rapid photospeed, which is a significant drawback in many industrial applications such as the large scale production of miniaturized integrated circuit components.

Moreover, most of the prior art positive photoresists which exhibit increased photospeed use substantial concentrations of sensitizers which absorb and do not bleach well in the deep ultraviolet radiation range and thus these resists cannot effectively be used to produce the very high resolution small line-and-space widths required in the production of microcircuitry components. Those resist compositions which have been developed using sensitizers that do bleach in the deep UV are generally not usable in the more conventional exposure ranges because they absorb so little in the 330 to 450 nanometer range, and are thus not rapidly transformed on exposure, that they exhibit very poor photospeed in these radiation ranges.

No prior art positive photoresist possesses high photospeed and has good resolution properties when exposed to deep UV radiation and yet is useful in the conventional exposure ranges as well.

SUMMARY OF THE INVENTION

1. Objects of the Present Invention

It is an object of the present invention to provide novel positive photoresist compositions which have excellent photospeed and resolution properties when exposed to radiation in the deep ultraviolet range and which can be used with conventional radiation exposure as well.

Another object of the present invention is to provide positive photoresist compositions having increased photospeed in comparison with prior art compositions used with deep ultraviolet exposures.

A further object of the present invention is to provide positive photoresist compositions as heretofore described which include a cresol-formaldehyde novolak resin produced from cresols mixed in proportions selected from a given range and a selected naphthoquinone diazide sensitizer.

An additional object of the present invention is to provide a photoresist coating, suitable for application to a substrate, utilizing the new photoresist compositions.

Still another object of the present invention is to provide a method for preparation of the novel photoresist compositions which will produce compositions with excellent photospeed and resolution properties when exposed to deep ultraviolet radiation.

Still a further object of the present invention is to provide fast photoresist compositions which exhibit particularly good development contrast and resolution when exposed to actinic radiation with a wavelength of from about 240 to 330 nanometers.

Yet another object of the present invention is to provide fast photoresist compositions particularly suited for use in the production of high-density miniaturized electronic components.

2. Brief Description of the Invention

In keeping with these objects and others which will become apparent hereinafter, the present invention resides, briefly stated, in a positive photoresist composition which comprises about 80 to 99 percent by weight of a cresol-formaldehyde novolak resin produced from a mixture of meta- and paracresol or from a mixture of ortho-, meta-, and paracresol, said cresols being present by weight in the mixture in proportions chosen from a selected range, together with about 1 to 20 percent by weight of ortho-naphthoquinone sensitizers.

A radiation-sensitive photoresist coating suitable for application to a substrate, exposure to actinic radiation and subsequent development in alkaline solution can be produced by dissolving the photoresist compositions of the present invention in an appropriate organic solvent or mixture of organic solvents.

The present invention also includes methods of preparation of the novel photoresist compositions and of photoresist coatings suitable for application to a substrate utilizing those photoresist compositions. The resist compositions of the present invention and the photosensitive coatings made therefrom display excellent photospeed while achieving a high degree of resolution and good development contrast. The compositions are particularly sensitive to radiation in the deep ultraviolet range, i.e., radiation with a wavelength of from 240 to 330 nanometers.

The sensitizers which comprise a component of the resist compositions of the present invention are selected from a group of substituted naphthoquinone diazide compounds which absorb radiation in the range of 240 to 330 nanometers but which are effective as solubility inhibitors even in low concentrations. Appropriate sensitizing compounds are disclosed, for example, in U.S. Pat. Nos. 3,646,118; 3,130,048; 3,640,992 and 3,785,825. The novelty of the resist compositions of the present invention and of the methods for producing the same resides in the use of novel mixtures of cresol isomers, wherein the proportions of the individual cresol isomers within the mixture are chosen from a particular range, to produce the novolak resins contained in these compositions, as well as the selection of sensitizers which are photoactive when exposed to deep ultraviolet radiation and which can be used in such low concentrations that any masking effects caused by the absorption of the sensitizers are minimized.

Photoresist compositions which include novolak resins produced by condensing the selected cresol mixtures with formaldehyde and which also include one of the selected naphthoquinone diazide compounds as a sensitizer have been found to be considerably faster in development than similar novolak-containing resists and to provide high resolution with deep ultraviolet exposures. Moreover, these novel photoresists provide good photospeed and development properties upon exposure to more conventional radiation as well.

The low sensitizer concentrations utilized in the subject resists ensure that the masking effect of the resist coating caused by the absorption by the novolak of radiation in the deep ultraviolet range is not enhanced by the absorption of the sensitizer as well. The small quantity of the selected sensitizer used in the present invention is sufficient to reduce the solubility in the unexposed resist coating while bleaching rapidly and permitting penetration of the radiation down to the substrate-coating interface. The sensitizers used in the present invention also absorb and are photoactive in the more conventionally used radiation range of 330 to 450 nanometers, and thus the resist compositions of the present invention are usable in those ranges as well. In the higher wavelengths, the novolak is almost transparent, and thus the problem of the resist's inherent masking effect is minimized.

The novolak resins which are produced according to the present invention can have a wide range of softening points, but those resins having softening points between 110° and 145° C. are particularly useful in resist compositions. For a given composition of cresols, the softening point of the novolak is correlated with its average molecular weight; i.e., novolaks with a higher average molecular weight have a higher softening point, and those with a lower average molecular weight have a lower softening point. The average molecular weight is in turn a function of the number of cresol units that become linked by methylene bridges as a result of the reaction with formaldehyde to form the resin molecules.

It is normally possible to raise the molecular weight and hence the softening point of the novolak by increasing the ratio of formaldehyde to cresols employed in the reaction, because the larger quantity of formaldehyde in the reaction mixture will cause a greater degree of linkage of the cresol units and hence larger resin molecules.

The properties of the photoresist compositions of the present invention are in marked contrast to prior art compositions utilized in the deep ultraviolet exposure range. The prior art compositions, whether negative photoresists or positive photoresists utilizing novolaks of different compositions or different sensitizers, do not provide both high resolution and rapid photospeed. Even the materials which provide acceptable resolutions and photospeed are not usable in the conventional exposure ranges because of the greatly reduced photoactivity of the sensitizers utilized when exposed to the higher wavelengths.

BRIEF DESCRIPTION OF THE DRAWING

The FIGURE is a three-variable graph with axes meeting at 60° angles with respect to one another, each point on said graph determining the respective percentages by weight of ortho-, meta-, and paracresol in a mixture of cresol isomers, and the quadrilateral ABCD drawn on said graph by connecting points A, B, C, and D with straight lines defining the range of proportions of cresol isomers in the cresol mixtures used in the present invention.

DETAILED DESCRIPTION OF THE INVENTION

A. Production of the Novolak Resins

Figure 1:
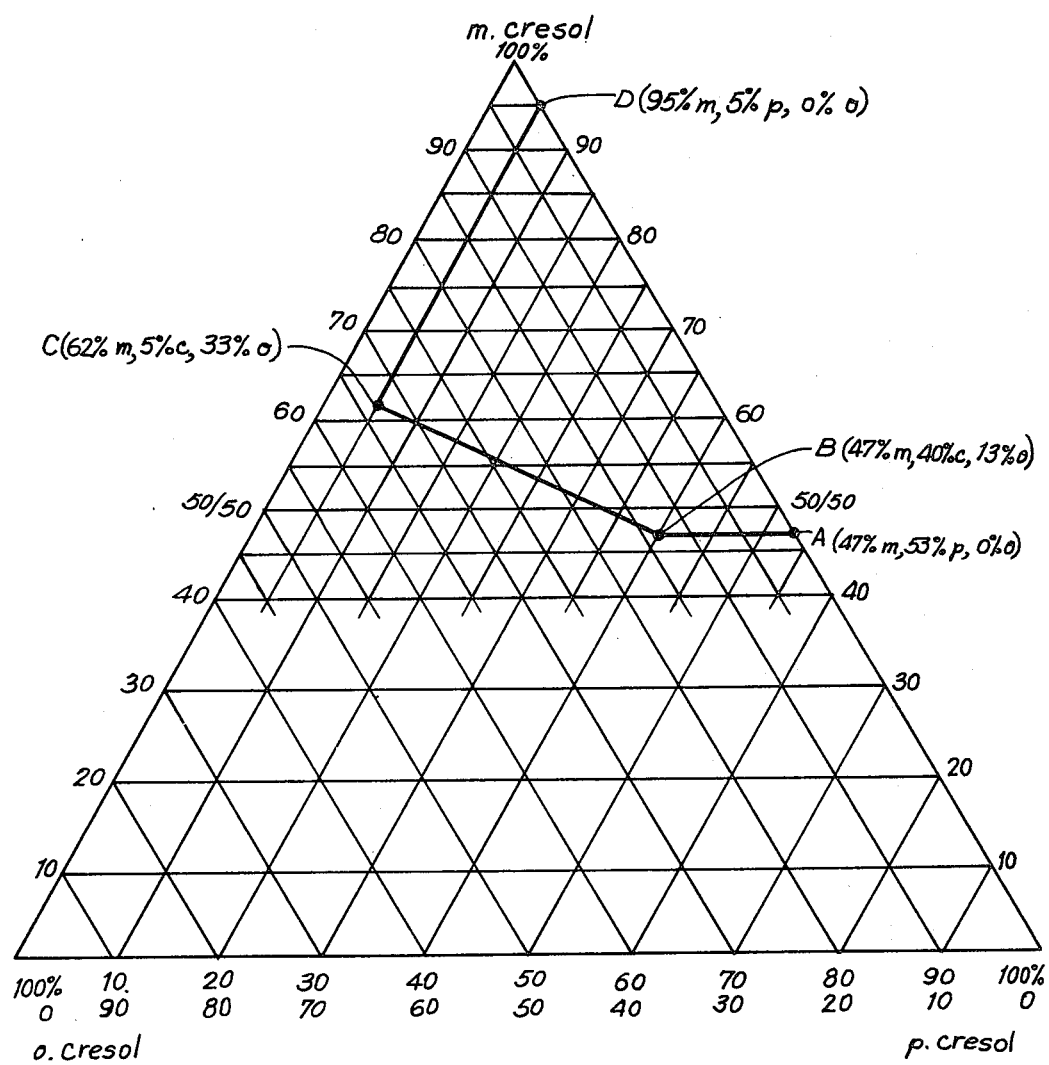

The novolak resins which are utilized to produce the photoresist compositions of the present invention are produced by condensation with formaldehyde of a mixture of meta- and paracresol or ortho-, meta-, and paracresol, with the various cresol isomers present by weight in the mixture in proportions selected from the area bounded by quadrilateral ABCD shown on the three-variable graph of FIG. 1.

The values of points A, B, C and D which define the corners of the quadrilateral in FIG. 1 are as follows:

| Point | cresol isomers | | |
|---|---|---|---|
| | meta | para | ortho |
| A | 47% | 53% | 0% |
| B | 47% | 40% | 13% |
| C | 62% | 5% | 33% |
| D | 95% | 5% | 0% |

The points which lie on the boundary lines AB, BC, CD, and DA of quadrilateral ABCD are included within the present invention as well.

To prepare the novolak resins, an amount of each cresol isomer appropriate to provide a mixture in which the proportions by weight of the isomers fall within the area ABCD shown in FIG. 1 is charged into a reaction vessel. A less than equivalent (in stoichiometric terms) quantity of an approximately 37% aqueous formaldehyde solution is then added to the cresols in the presence of an acid; for example, a small quantity of oxalic acid. The reaction must be conducted in an acidic medium in order to ensure that a novolak-type resin is formed; i.e., one which has methylene bridges between the phenolic nuclei as shown in the following diagram as a typical example:

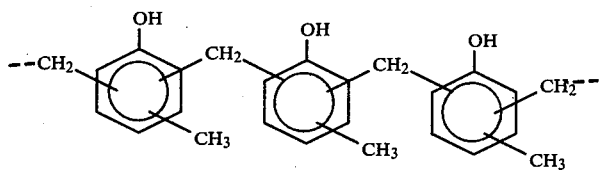

If the condensation of the cresols with formaldehyde is conducted in an alkaline medium, resins known as resoles will be formed. Resole-type resin compositions are not within the scope of the present invention.

It is also necessary in synthesizing the novolak resins that the amount of formaldehyde charged into the reaction vessel be less than a stoichiometrically equivalent quantity in comparison with the quantity of cresols charged in order to produce a fusible, soluble resin. If an excess of formaldehyde is charged, the resin formed will in most cases be insoluble and totally unsuitable for the preparation of photoresist compositions.

The reaction mixture, comprising the charged cresols, aqueous formaldehyde solution, and acid is first heated to reflux gently at about 100° C. If a violent exothermic reaction ensues, the reaction mixture is cooled by immersing the flask in a water bath for the duration of the exotherm.

The gentle reflux is allowed to proceed for approximately 12 to 24 hours depending on the reactivity of the cresols charged and the formaldehyde-cresol ratio in the mixture. The metacresol is generally more reactive than the other cresol isomers and, therefore, if the cresol mixture is predominantly meta-, a shorter reflux time will be required to complete the reaction. In addition, the greater the ratio of formaldehyde to cresols (up to a maximum of a molar ratio of formaldehyde to cresols of about 0.9:1), the more quickly the reaction will proceed.

At the end of the reaction, water is distilled off, first at atmospheric pressure and then at a pressure of about 30 to 50 millimeters of mercury until the temperature of the reaction mixture reaches approximately 225° C., at which point the vacuum, which is applied by means of a vacuum pump, is increased to near-total levels at a temperature of about 230° C. to distill off unreacted cresol monomers.

The distillates are collected in a round-bottom flask which is attached to the distillation condenser.

After distillation, the resultant liquefied novolak is poured into a cooling tray in an atmosphere of nitrogen to avoid oxidation and solidifies upon cooling to room temperature to a brittle mass.

B. Production of Photoresist Compositions Comprising a Novolak Resin and a Sensitizer as an Unreacted Component To produce photoresist compositions with a novolak and a sensitizer as unreacted components, the brittle novolak resin is fragmented with, for example, a mortar and pestle, and added to a mixture of suitable organic solvents, particularly ethyl Cellosolve acetate, butyl acetate and xylene in an amber-colored bottle. A quantity of a naphthoquinone diazide sensitizing compound or a combination or blend of such sensitizers is then added to and dissolved in the solution containing the novolak. The proportions by weight of the novolak and sensitizer in the solution which are dissolved in the solvent mixture are such that the novolak resin comprises 80 to 99 percent by weight of the total weight of resin and sensitizer while the sensitizer comprises 1 to 20 percent by weight of the total weight of resin and sensitizer.

The naphthoquinone diazide sensitizing compounds used in producing the photoresist compositions of the present invention which comprise a novolak and a sensitizer as unreacted components are all esters of one of the following naphthoquinone diazide sulfonyl chloride sensitizers:

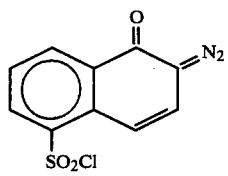 

Compound I        Compound II

The chemical name of Compound I is a naphthoquinone-(1,2)-diazide-5-sulfonyl chloride, and the chemical name of Compound II is naphthoquinone-(1,2)-diazide-4-sulfonyl chloride. These sensitizers are exemplified by the following formulas:

$R_1$—O—$CH_2$—$CH_2$—O—$CH_3$     Formula 1

$R_1$—O—$CH_2$—$CH_2$—O—$(CH_2)_3$—$CH_3$     Formula 2

Formula 3

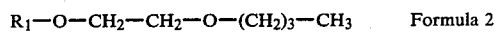

Formula 4

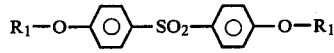

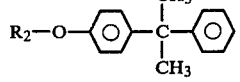

Formula 5

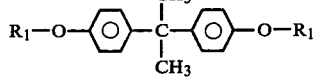

Formula 6

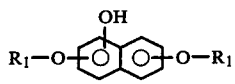

Formula 7

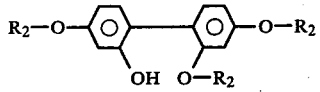

wherein

R₁ is 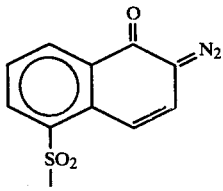 and

R₂ is 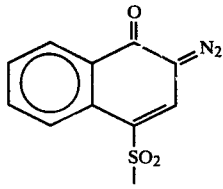

After the resin (unsensitized) and sensitizer have been added to the solvents, the bottle is agitated until all solids are dissolved, which usually takes about 12 hours. The resultant photoresist solution is microfiltered using a millipore microfiltration system under approximately 30 pounds per square inch of pressure of nitrogen or other inert, oxygen-lacking ambient atmosphere.

Additives such as dyes, anti-striation agents, plasticizers, adhesion promoters, speed enhancers, and non-ionic surfactants may be added to the solution of novolak resin and sensitizer before the solution is coated onto a substrate.

Exemplificative dye additives that may be used together with the photoresist compositions of the present invention include Methyl Violet 2B (C.I. No. 42535), Crystal Violet (C.I. No. 42555), Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used up to a five percent weight level, based on the combined weight of novolak and sensitizer.

Plasticizers which may be used include, for example, phosphoric acid tri-(β-chloroethyl)-ester; stearic acid; dlcamphor; polypropylene; acetal resins; phenoxy resins; and alkyl resins at one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, β-(3,4-epoxy-cyclohexyl)-ethyltrimethoxysilane; p-methyl-disilane-methyl methacrylate; vinyltrichlorosilane; and γ-amino-propyl triethoxysilane up to a 4 percent weight level, based on the combined weight of novolak and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications where speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Non-ionic surfactants that may be used include, for example, nonylphenoxy poly(ethyleneoxy) ethanol; octylphenoxy (ethyleneoxy) ethanol; and dinonylphenoxy poly(ethyleneoxy) ethanol at up to 10 percent weight levels, based on the combined weight of novolak and sensitizer.

C. Preparation of Resist-Coated Substrates

The filtered resist solution can be applied to a substrate by any conventional method used in the photoresist art, including dipping, spraying, whirling and spin coating. When spin coating, for example, the resist solution can be adjusted as to the percentage of solids content in order to provide coatings of the desired thickness given the type of spinning equipment utilized and the amount of time allowed for the spinning process.

The photoresist coatings produced by the above-described procedure are particularly suitable for application to thermally grown silicon/silicon dioxide-coated wafers such as are utilized in the production of microprocessors and other miniaturized integrated circuit components. An aluminum/aluminum oxide wafer can be used as well.

After the resist composition solution is coated onto the substrate, the substrate is baked at approximately 100° to 105° C. until substantially all the solvent has evaporated and only a thin coating of photoresist composition on the order of a micron in thickness remains on the substrate. The coated substrate can then be exposed to actinic radiation in any desired exposure pattern, produced by use of suitable masks, negatives, stencils, templates, etc.

The exposed resist-coated substrates are next substantially immersed in alkaline developing solution in, for example, a Teflon tank. The solution is preferably agitated, for example, by nitrogen burst agitation. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates will be treated with a buffered, hydrofluoric acid-based etching solution. The resist compositions of the present invention are resistant to acid-based etching solutions and provide effective protection for the unexposed resist-coated areas of the substrate.

The novolak photoresist compositions of the present invention are particularly suitable for exposure to actinic radiation in the deep ultraviolet range; i.e., radiation with wavelengths of approximately 240 to 330 nanometers. The naphthoquinone diazide sensitizers utilized herein are effective solubility-rate reducers of the novolak even in very low concentrations. The compositions of the present invention utilize a low concentration of these sensitizers, although an adequate quantity to provide a sufficient solubility differential between the exposed and unexposed portions of the resist so that good development contrast is achieved, and thus any masking effect caused by the absorption of the sensitizer in the deep UV range is minimized. The resists of the present invention are also suitable for exposure to radiation in the more conventional ultraviolet or near-ultraviolet range of 330 to 450 nanometers.

The novel photoresist compositions disclosed herein are superior to prior art positive photoresists utilized with deep ultraviolet radiation exposures to produce high resolution relief patterns with very small line-and-space widths because the compositions of the present invention provide better photospeed than the prior art resists, achieve excellent resolution down to line widths of about 0.75 microns and are usable in the conventional ultraviolet range as well. The subject compositions have faster photospeed when exposed to deep ultraviolet radiation than even closely related resist compositions containing a cresol-novolak resin and one of the same sensitizers used in the present invention, but where the cresol novolak resin is produced from a single cresol or mixture of cresols that is not within the designated area shown in FIG. 1.

After the following examples, data are given illustrating the superiority of the photoresists of the present invention, particularly with regard to improved photospeed, in comparison with related prior art compositions. In all instances where such comparative data are given, the resist coated substrates used were developed under optimum development conditions. These conditions included a one-minute exposure time, a constant development temperature of 22° C., optimum developer systems, and use of a nitrogen agitation immersion development mode. The developer systems were selected so as to provide complete development of the exposed resist area while obtaining a maximum unexposed resist film thickness loss not exceeding 10 percent of initial thickness.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Novolak Resins from m- and p-Cresols 272.5 g. of 98 percent pure m-cresol and 272.5 g. of p-cresol were mixed in a 1,000 ml. four-neck resins flask equipped with a stirrer, heating capacity and a reflux condenser. The proportions by weight of the cresols in the mixture were approximately 50 percent m-cresol and 50 percent p-cresol. 239.3 g. of 37.7 percent aqueous solution of formladehyde was added to the cresol mixture together with 7.26 g. of oxalic acid dihydrate in a 60 ml. aqueous solution, and the reaction mixture was then heated to reflux gently at about 100° C. An exothermic condensation reaction ensued and a haze was formed which increased rapidly. The flask was then partially immersed in a water bath in order to cool the reaction mixture. The condensation reaction was allowed to continue for approximately 18 hours at reflux temperature. Heat was applied and distillation at atmospheric pressure under a constant flow of nitrogen commenced. When the temperature of the reaction mixture reached approximately 220° to 225° C., a partial vacuum pressure of 30 to 50 mm. of mercury was applied with a Welch Duo-Seal vacuum pump and was gradually increased until a maximum vacuum of about 0.2 mm. of mercury was reached when the mixture was at approximately 230° C. The mixture was then heated further and distilled for approximately an additional one hour with the distillates being collected in a round-bottomed flask. About 278.5 g. of aqueous distillate was obtained from the atmospheric pressure phase of the distillation. About 186 g. of vacuum distillate was obtained.

At the end of the distillation, the liquefied novolak resin remaining in the flask was poured into a cooling tray in an atmosphere of nitrogen. The product solidified upon cooling to room temperature. Approximately 377 g. of novolak resin was obtained having a softening point of 138° to 139° C.

EXAMPLE 2

Novolak Resin from o-, m- and p-Cresols 339.89 g. of m-cresol, 96.54 g. of p-cresol, and 48.27 g. of o-cresol were mixed in a flask as described in Example 1. The proportions by weight of cresols in the mixture were approximately 70 percent meta, 20 percent para, and 10 percent ortho. 271.5 g. of 37.7 percent aqueous solution of formaldehyde was then added to the cresol mixture together with about 6 g. of oxalic acid and the procedure of Example 1 was then followed to complete the synthesis.

This procedure yielded approximately 438.2 g. of novolak resin having a softening point of about 143° C.

EXAMPLE 3

Low Softening Point Novolak Resin from o-, m-, and p-Cresols 241.35 g. of m-cresol, 181.1 g. of p-cresol and 60.33 g. of o-cresol were mixed in a flask as described in Example 1. The proportions by weight of cresols in the mixture were approximately 50 percent meta-, 37.5 percent para- and 12.5 percent ortho-. 271.52 g. of 37.7 percent aqueous formaldehyde solution was added to the cresol mixture with about 6 g. of oxalic acid and the procedure of Example 1 was then followed to complete the synthesis.

The procedure yielded approximately 453 g. of novolak resin having a softening point of about 119.2° C.

EXAMPLE 4

Preparation of a Photoresist Composition

Into an amber-colored 200 ml. cylindrical bottle were weighed 4 g. of 2-methoxyethyl-naphthoquinone-(1,2)-diazide-5-sulfonate, 24 g. of the novolak resin produced according to Example 1 and 72 g. of a solvent mixture. The solvent mixture comprised 85 percent ethyl Cellosolve acetate, 10 percent butyl acetate and 5 percent xylene. The bottle was then rolled on a high-speed roller for approximately 12 hours at room temperature until all solids were dissolved. The resulting resist solution was subsequently filtered through a 0.2 micron pore-size filter using a millipore microfiltration system (a 100 ml. barrel and a 47 mm. disk were used). The filtration was conducted in a nitrogen environment under a pressure of 30 pounds per square inch. Approximately 100 g. of resist solution was obtained.

EXAMPLE 5

Coating of a Photoresist Composition onto Substrate 100 g. of the resist composition of Example 4 was spin-coated with a spinner manufactured by Headway Research Inc. (Garland, Tex.) onto a thermally grown silicon/silicon dioxide-coated wafer of two inches in diameter and 5,000 A of oxide in thickness. A uniform coating, after drying, of one micron of film was obtained at a spinning velocity of 5,000 revolutions per minute for 30 seconds. The coated wafers were subsequently baked in an air-circulating oven at 100° to 105° C. for a 30 minutes and the film thickness was then measured with a Sloan Dektak surface profilometer unit.

EXAMPLE 6

Exposure of Coated Substrate

A UV-3 Modification of the Perkin-Elmer 240 Micralign projection aligner with a UBK-7 selective filter was used to provide deep ultraviolet exposure of the coated wafers of Example 5, the exposure radiation being in the range of 270 to 330 nanometers. A Perkin-Elmer Meander mask, with line and space widths of varying sizes, including some as small as 0.75 microns, was used to provide a selective exposure pattern. Exposive times were varied in order to determine the photospeed of the resist, i.e., the minimum amount of exposure time which will solubilize the exposed areas of the resist so that the coating in the exposed areas will be completely removed during development.

EXAMPLE 7

Development of Exposed Resist-Coated Substrates

The resist-coated wafers produced and exposed according to Examples 5 and 6 were placed on circular Teflon wafer boats and immersed in two-liter Teflon containers containing Waycoat Positive LSI Developer Solution, Type I or Type II (Philip A. Hunt Chemical Corp.), an aqueous alkaline buffered solution, with a pH of about 12.5. Nitrogen-burst agitation was provided in the Teflon container to aid and accelerate development. The wafers were allowed to remain immersed in the developer solution for one minute. Upon removal, the wafers were rinsed in water and baked in an air-circulating oven at about 125° C. to increase the adhesion and chemical resistance of the undissolved coating.

The following data relating to the photospeed of various resist compositions was generated using coating, exposure and development methods comparable to those described in the preceding examples for all resists tested. Moreover, all resist compositions were coated onto identical thermally grown silicon/silicon dioxide-coated wafers, were exposed to the same source of radiation, and were developed under the same conditions in the optimized developer systems. The photospeed values are indicated in terms of the relative minimum exposure values defined in terms of the Perkin-Elmer UV-3 modification of the Micralign 240 exposure instrument required to completely solubilize the exposed areas of the resist coating during development at a constant exposure intensity, so that those resist areas were completely removed upon subsequent development.

TABLE I

Photospeed of Resist Compositions Exposed to Deep Ultraviolet Radiation

| Ratio of cresols used to produce novolak | Sensitizers | | |
|---|---|---|---|
| | 2-methoxyethyl-naphthoquinone-(1,2)-diazide-5-sulfonate (14.3% by wt.) | 2-butoxyethyl-naphthoqui-acid-p-cmyl-zide-5-sulfonate (14.3% by wt.) | naphthoquinone-(1,2)-diazide 4-sulfonic phenol ester (14.3% by wt.) |
| 30% m-,[2] 60% p-, 10% o-. | 4.59 secs. | 7.83 secs. | 5.95 secs. |
| 70% m-,[1] 20% p-, 10% o-. | 1.62 secs. | 2.7 secs. | 1.89 secs. |
| 33% m-,[2] 50% p-, 17% o-. | 4.2 secs. | 7.4 secs. | 5.4 secs. |

[1]The composition containing this novolak comes within the scope of the present invention.
[2]The compositions containing these novolaks do not come within the scope of the present invention.

The data on the above tables reflects the great increase in photospeed as measured by the minimum exposure time required to completely solubilize the exposed areas of the resist compositions of the present invention. In addition, the resists of the present invention exhibit excellent resolution even in reproducing line-and-space dimensions of 0.75–1.0 microns, and possess adhesion and development contrast qualities at least equivalent to related prior art photoresists.

It will thus be seen that there are provided compositions and methods which achieve the various objects of the invention and which are well adapted to meet the conditions of practical use.

As various possible embodiments might be made of the above invention, and as various changes might be made in the embodiments above set forth, it is to be understood that all matter herein described is to be interpreted as illustrative and not in a limiting sense.

What is claimed as new and desired to be protected by Letters Patent is set forth in the appended claims:

1. A positive photoresist composition, comprising a mixture of:
   (a) about 80 to 99 percent by weight of a cresolformaldehyde novolak resin produced by condensing a mixture of cresol isomers with formaldehyde in the presence of acid, said mixture of cresols including percentages by weight of ortho-, meta-, and paracresols whose values are within the area bounded by quadrilateral ABCD in FIG. 1, said novolak resin having a softening point in the range of 110° to 145° C.; and
   (b) about 1 to 20 percent by weight of at least one napthoquinone diazide sensitizer selected from the group consisting of:

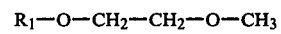

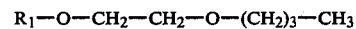

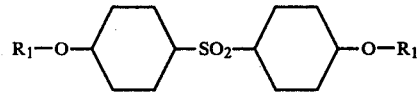

-continued

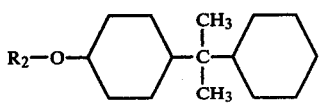

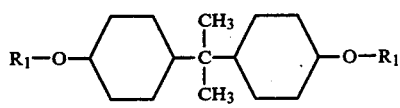

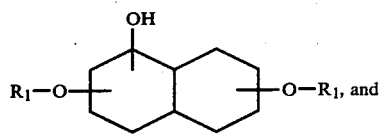

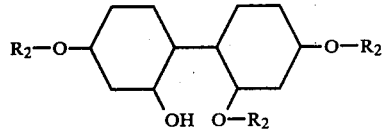

wherein

R₁ is 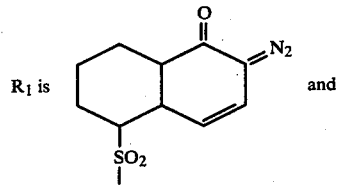 and

-continued

R₂ is 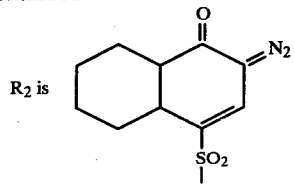

2. A positive photoresist composition suitable for application to a substrate, comprising a mixture as set forth in claim 1 and at least one organic solvent.

3. A positive photoresist composition, as set forth in claims 1 or 2, wherein the molar ratio of formaldehyde to cresols reacted to produce the novolak does not exceed 0.9:1.

4. A positive photoresist composition, as set forth in claims 1 or 2, wherein the mixture of cresols comprises 47 percent metacresol and 53 percent paracresol by weight.

5. A positive photoresist composition, as set forth in claims 1 or 2, wherein the mixture of cresols comprises 47 percent metacresol, 40 percent paracresol and 13 percent orthocresol by weight.

6. A positive photoresist composition, as set forth in claims 1 or 2, wherein the mixture of cresols comprises 62 percent metacresol, 5 percent paracresol and 33 percent orthocresol by weight.

7. A positive photoresist composition, as set forth in claims 1 or 2, wherein the mixture of cresols comprises 95 percent metacresol and 5 percent paracresol by weight.

8. A positive photoresist composition, as set forth in claims 1 or 2, wherein the mixture of cresols comprises 50 percent metacresol and 50 percent paracresol by weight.

9. A positive photoresist composition, as set forth in claims 1 or 2, wherein the mixture of cresols comprises 70 percent metacresol, 20 percent paracresol and 10 percent orthocresol by weight.

10. A positive photoresist composition, as set forth in claims 1 or 2, wherein the mixture of cresols comprises 50 percent metacresol, 37.5 percent paracresol and 12.5 percent orthocresol by weight.

* * * * *